United States Patent [19]

Wu

[11] Patent Number: 4,904,498

[45] Date of Patent: * Feb. 27, 1990

[54] METHOD FOR CONTROLLING AN OXIDE LAYER METALLIC SUBSTRATES BY LASER

[75] Inventor: Jeff C. Wu, Clemmons, N.C.

[73] Assignee: AMP Incorporated, Harrisburg, Pa.

[ * ] Notice: The portion of the term of this patent subsequent to Oct. 3, 2006 has been disclaimed.

[21] Appl. No.: 352,083

[22] Filed: May 15, 1989

[51] Int. Cl.$^4$ ............................................. B05D 3/06
[52] U.S. Cl. ................................. 427/53.1; 427/43.1; 204/35.1; 430/945; 219/121.61; 156/643
[58] Field of Search ........................... 427/53.1, 43.1; 204/35.1, 37.6, 29; 430/945, 321; 156/643; 219/121 LA

[56] References Cited

U.S. PATENT DOCUMENTS

| | | | |
|---|---|---|---|
| 4,063,063 | 12/1988 | Funck et al. | 219/121 LM |
| 4,348,263 | 9/1982 | Draper et al. | 204/29 |
| 4,368,080 | 1/1983 | Langen et al. | 134/1 |
| 4,671,848 | 1/1987 | Miller et al. | 156/643 |
| 4,832,798 | 5/1989 | Cvijanovich et al. | 204/15 |

Primary Examiner—Norman Morgenstern
Assistant Examiner—Roy V. King
Attorney, Agent, or Firm—William B. Noll

[57] ABSTRACT

This invention relates to a method for controlling or limiting the formation of an oxide layer on a metallic substrate such as nickel or nickel alloy, over which a polymeric plating resist has been placed, then selectively removed by a focussed excimer laser beam applied thereto. The method comprises the steps of applying a carbon-containing polymeric plating resist to a metal substrate having an oxide layer thereon of a thickness between about 20 to 40Å. Thereafter, a selected area of said resist coated metal substrate is subjected to a single shot from an excimer laser to ablate said resist from within said area, wherein the laser energy is absorbed primarily at the metallic substrate and the energy density of the said laser is in excess of that required to ablate so as to produce a thin uniform layer of oxide over said substrate, said oxide layer, principally nickel oxide, having a thickness no greater than about 7Å. Ancillary features of this method include improved substrate surface characteristics by the development of a carbon enriched sub-surface layer beneath the ablated area.

4 Claims, No Drawings

METHOD FOR CONTROLLING AN OXIDE LAYER METALLIC SUBSTRATES BY LASER

FIELD OF INVENTION

This invention is directed to a method of controlling the layer of oxide formation on a metal substrate, having a polymeric coating resist thereon, by the application of an excimer laser beam focussed thereagainst to selectively remove such resist. More precisely, the method hereof represents an improvement on the invention described in co-pending applications, Ser. Nos. 180,417, now U.S. Pat. No. 4,877,644, and 343,764 assigned to the assignee herein, which applications are incorporated herein by reference.

BACKGROUND OF THE INVENTION

The present invention relates to a method of controlling the oxide formation, such as nickel plated copper alloy, on a metal substrate so as to allow for the selective plating thereof by a precious metal, such as gold or an alloy thereof.

The selective plating thereof is achieved by selectively removing a plating resist covering said substrate. Such removal is accomplished by matching or coupling the laser wavelength, preferably one operating in the U.V. range, such as an excimer laser, with the plating resist and metal substrate.

The laser energy density required to achieve such oxide control must exceed the threshold energy density needed to achieve complete removal of such resist in a single focussed laser beam.

A preferred embodiment of this invention is the selective plating of electrical terminals. Typically, such terminals are stamped and formed from metal strip and are attached to a carrier strip which is useful for strip feeding the terminals through successive manufacturing operations. One necessary manufacturing operation involves plating; i.e., electroplating the electrical contact surfaces of the strip fed terminals with precious metal or semi-precious metal, such as gold or alloys thereof. Such metals are characterized by good electrical conductivity and little or no formation of oxides that reduce said conductivity. Therefore these metals, when applied as plating, will improve conductivity of the terminals. However, the high cost of these metals has necessitated precision deposition on the contact surfaces of the terminals, and not on surfaces of the terminals on which plating is not necessary. Unfortunately, a necessary criteria to good electrical contact is the preparation of an essentially oxide free metal substrate upon which the precious or semi-precious metal is plated. Due to the unique requirements of electrical terminals, and the need to precisely control the plating thereof, certain mechanical and/or chemical means cannot be used. For example, U.S. Pat. No. 4,063,063 to Funck et al. teaches a method of descaling a metal surface by the combination of a sweeping laser beam to detach an adhering oxide film, followed by removal of such oxide film, such as by mechanical, chemical or electrolytic means. Such patent appears to be limited to the treatment of a broad surfaced product, such as a continuous strip. U.S. Pat. No. 4,368,080 to Langen et al. teaches a method of removing rust from a metal surface by focusing a laser beam on such surface in a controlled environment.

It is now known that laser beams have been employed to improve metal substrate surfaces for subsequent plating. In co-pending application, Ser. No. 133,779, now U.S. Pat. No. 4,832,798, and owned by the assignee herein, a technique is taught whereby the porosity of a nickel plated substrate is significantly reduced by a laser beam to permit a reduction in the level of precious metal plating needed on such nickel to produce a good contact surface.

U.S. Patent No. 4,348,263 to Draper et al. and directed to a process for surface melting of a substrate prior to plating, teaches a method of making an electrical contact by the steps of applying a first protective layer to a substrate, subjecting said protective layer and a portion of said substrate to melting by means of an electron beam or laser prior to the deposition. A related work by Draper, published in the *Gold Bulletin,* 1986, 19, entitled "Laser Surface Alloying of Gold," contains an illustrated showing on the mechanism of laser surface alloying by the use of focussed laser pulsing.

Laser beams have also been used as a means to remove or ablate a substrate coating whereby to expose such substrate. By way of background, ablation is defined as the process of removal of a part such as by melting or vaporization. The laser is the mechanism by which one may achieve the selective melting or vaporization. By the use of different lasers, particularly ones utilizing a broadly differing wavelength, the general process of laser ablation is affected. For example, by the use of an excimer laser, operating in the U.V. range, coupled with a resist essentially transparent to the wavelength of such laser, and a metal substrate from which the resist is to be removed and which absorbs such wavelength in co-pending application, Ser. No. 180,417, now U.S. Pat. No. 4,877,644, a different laser assisted material removal process is observed. The latter process, which is more energy efficient, may be termed "patch blowoff." That is, rather than melting or vaporizing the resist, an interesting phenomena occurs at the resist/substrate interface resulting in the overlying resist being blownoff, essentially as solid particles. Thus, while laser ablation has been broadly used to define any process where a laser is used to assist in a material removal process, it will be appreciated that the certain parameters applied will render the various approaches quite distinctive.

Returning now to the broad concept, it can be acknowledged that selective removal of a resist may be accomplished by the technique known as laser ablation. Reports have appeared in the literature regarding attempts at laser ablation of polymer coatings on metals, and regarding methods of multi-shot removal of polymer coatings on non-metals. R. Srinivasan et al, in the *JAP* 59, 3861 (1986) and *JVST, B*1, 923 (1983) describe, for example, the use of excimer laser wavelengths which are strongly absorbed directly in the polymer itself to achieve removal of polymer by chemical bond-breaking or heating to vaporization, or a combination of both. However, the authors found that polymer ablation occurs when the laser light is absorbed within about the first 0.2 micron or less of the polymer surface. Then only that polymer material within the characteristic absorption depth was removed. In order to remove a thicker polymer film, such as is necessary for most electroplating requirements, multiple laser shots would be required. The use of multiple shots is much less desirable than single shot removal. One problem associated with the method of Srinivasan et al, wherein the laser light is directly absorbed in the polymer, is that choosing a laser wavelength too strongly absorbed in the polymer necessarily implies a small absorption depth and small thickness removed. On the other hand, choosing a wavelength too weakly absorbed in the polymer precludes depositing sufficient energy per unit volume of polymer to achieve ablation. The compromise value between these extremes dictates that no more than about 0.3 micron per pulse can be removed in the best case. Cole et al, in *Mat. Res. Soc. Symp. Proc.* 72, 241 (1986), concur with Srinivasan et al in this finding. The above process represents the current state of the art on excimer laser ablation of polymers.

In U.S. Pat. No. 4,671,848 to Miller et al, a method for the removal of a dielectric coating from a conductor, by means of a focused, high energy radiation source, is taught. More particularly, in said method a laser source is focused to a point above the coating which results in a plasma or ionized region being formed. As a consequence, the coating is removed in a preselected region on the underlying conductor. In other words, the laser ablation depends on absorption of laser light by ionized air or other plasma and transmission to the dielectric. A difficulty of this method is the ability to control and adjust the air breakdown so as to ensure there is no damage to the conductor, i.e. underlying substrate, and to achieve removal of the residual layer. Another difficulty is that only a small area corresponding to the tight focus region can be removed on each shot. Miller et al state that extended areas are to be ablated by multiple shots while moving the workpiece, or the laser focus.

Thus, whether dealing with the conventional ablation process, or the more recently defined practice of "patch blowoff," the concerns have been primarily with the most effective or efficient means to achieve the resist removal. That is, there appears to have been little concern with improving the surface adhesion properties of the metal substrate upon which selective plating is required.

The present invention accomplishes this goal by carefully coordinating the energy density of the excimer laser beam with that of the threshold energy necessary to completely remove the resist in the focussed area by a single shot or laser pulse.

SUMMARY OF THE INVENTION

The present invention relates to a method for controlling the formation of an oxide layer on a metallic substrate, such as nickel plated copper alloy, over which a polymeric plating resist has been placed, then selectively removed by the application of a focussed excimer laser beam thereto. The first step thereof consists of applying a carbon-containing polymeric plating resist to a metal, such as nickel plated copper alloy, substrate having a natural oxide layer thereon of a thickness between about 20 to 40 Å. Such a layer would normally interfere with the application of a tightly adherent precious metal to the substrate. Traditional, after exposing the substrate, some chemical treatment was required to remove or reduce the oxide layer before plating. By the further steps hereof, such intermediate chemical treatment has been eliminated. More particularly, such further steps include subjecting a selected area of said resist coated nickel substrate to a single shot from an excimer laser to ablate or remove said resist from within said area, wherein the energy density of the said laser is in excess of that required to ablate or remove so as to leave a thin uniform layer of oxide over said substrate. The substrate will be seen to exhibit a carbon enriched subsurface layer beneath the ablated area which limits the formation of an oxide layer to a thickness no greater than about 7 Å.

DETAILED DESCRIPTION OF THE PREFERRED EMBODIMENT

The invention relates to a method for improving the quality of a metal substrate, such as nickel plated copper alloy, for receiving a selected application of a precious or semi-precious metal. More particularly, this invention is directed to a method of controlling the layer of oxide formation on a metal substrate, having a carbon bearing polymeric resist thereon, by the application of an excimer laser beam focussed thereagainst to selectively remove such resist and present areas of substrate suitable for precious or semi-precious metal plating.

By way of brief background, in the field of laser applications there are several commercial units which operate at different wavelengths. For example, excimer lasers form a group of pulsed high-pressure gas lasers which emit various ultraviolet wavelengths, depending on the lasing medium, such as 193 nm, 248 nm, 308 nm and 351 nm. At the opposite end of the spectrum, operating in the infrared region are such lasers whose laser sources are carbon dioxide ($CO_2$), and neodymium doped yttrium-aluminum garnet (Nd:YAG). By way of example and comparison, typical wavelengths for the three commercial laser units are as follows:

| | |
|---|---|
| Excimer | 193, 248, 308, 351 nm |
| $CO_2$ | 10,600 nm |
| ND:YAG | 1,064 nm. |

It was discovered in co-pending application, Ser. No. 180,417, that the excimer laser offered an opportunity, when coupled with the characteristics of the resist and metal substrate, to successfully and cleanly ablate or remove the resist with a single focussed laser beam or pulse. That is, for single shot resist removal, it was discovered that the proper laser and wavelength range be coordinated with both the metal substrate and the plating resist over the metal substrate to be plated. It is necessary that the laser energy be absorbed primarily at the metal substrate. Therefore, the plating resist selected to practice this invention must have a low optical absorption coefficient, e.g. with an absorption co-efficient preferably no greater than about 1000 cm$-1$ for a 3 micron film thickness. A suitable plating resist for use at laser wavelengths between, for instance about 300 to 360 nm, is a styrene acrylic copolymer, manufactured by Thiele-Engdahl. The optical absorption coefficient is wavelength related as illustrated in the following data of TABLE I.

TABLE I

| ABSORPTION COEFFICIENTS ($cm^{-1}$) Plating Resist Thickness | |
|---|---|
| Wavelength | Ave* |
| 351 nm | 666.5 |
| 308 nm | 725.1 |
| 248 nm | 7580.1 |

*Average of resist thickness between 73 and 209 microinches.

The polymer plating resists contemplated by this invention are further characterized by a threshold energy density, namely the amount of energy density of an excimer laser to completely ablate or remove such resist from a selected area of a metal substrate, in the range of from 1.2 J/cm² to 1.8 J/cm².

A second and equally important factor is the reflective value of the metallic substrate, or its reflectivity. Reflectivity is wavelength related. The data of TABLE II illustrates this relationship.

TABLE II

| Wavelength (microns) | SUBSTRATE REFLECTIVITY (%) | | |
|---|---|---|---|
| | Al | Cu | Ni |
| .25 | | | 47.5 |
| .26 | 92.2 | 35.5 | |
| .30 | | | 41.5 |
| .315 | 92.4 | 35.5 | |
| .36 | 92.5 | 41.5 | |
| 1.00 | 94.0 | 98.5 | 74 |
| 8.00 | | | 96 |
| 10.00 | 98.7 | 98.9 | |

From TABLE II, it is apparent that aluminum is a highly reflective metal surface over a broad range of wavelengths. With such high reflectance, only a limited amount of energy is absorbed by the aluminum, an amount insufficient to effect ablation of a plating resist thereover in accordance with this invention. In contrast, both copper and nickel reveal reflectivity values within a 35 to 50% range for the lower wavelengths, values which are well sited to practice this invention. For reasonable efficiency, the metal substrate should reflect no more than about 70%, i.e. absorbing 30%. In such practice, it will be understood that the laser beam is primarily absorbed by the metal substrate which transmits energy to the overlying plating resist, primarily by conduction.

To demonstrate the effectiveness of controlling the depth of the oxide layer on a resist coated Ni-plated substrate by excimer laser ablation or removal of selected areas of the resist, two series of tests were conducted. The results thereof are reported in TABLE III.

TABLE III

| Nickel Oxide Thickness Measured From AES Depth Profile | | |
|---|---|---|
| Sample | Energy Density (Number of shots) | Oxide* Thickness (Å) |
| Flat Samples | | |
| A | Control | 25.5 |
| B | 2 J/cm², (1 shot) | 6.0 |
| C | 2 J/cm², (2 shots) | 6.0 |
| D | 2 J/cm², (3 shots) | 7.5 |
| Formed Samples | | |
| E | Control | 10.5 |
| F | 0.4 J/cm², (1 shot) | 15.0 |
| G | 0.8 J/cm², (1 shot) | 12.0 |
| H | 1.8 J/cm², (1 shot) | 7.5 |

*Estimated values obtained by multiplying 1.5 to Ta₂O₅ equivalent layer thickness measured from AES depth profile.

From the above it can be seen that by the use of single shot, high energy density ablation (Samples B and H) there was a significant reduction in the oxide layer from the controls (Samples A and E). At the lower energy densities (Samples F and G) the oxide thickness was close to, and in fact increased above, the control. Additionally, from this data it would appear that multiple laser shots (samples C and D) had no effect on further reducing the oxide layer. Thus, optimum results are achieved by a single laser shot which exceeds the threshold energy density, preferably a range of 10 to 100% greater than the level of said threshold energy density, preferably between about 1.2 J/cm² and 1.8 J/cm². An interesting phenomenon was observed in those laser ablated samples on which a thin oxide layer resulted. Specifically, a significant sub-surface "carbon enriched" layer was found in such ablated samples, and that the carbon levels were further reduced with increasing number of shots, or with higher laser energy density. While data has not been developed to support the proposition, it is theorized that the sub-surface carbon layer is highly beneficial by increasing the hardness of the surface, i.e. case hardening by carbon diffusion; and, by improving the adhesion of gold or other precious metal plated on the ablated area.

One advantage to be observed by this invention is the improved surface of the ablated area. As a result, the activation cycle normally used prior to plating, such as by gold, can be eliminated. Further, it has been observed that the growth of the oxide layer is from nil to minimal over an extended period of time. That is, plating may occur immediately after laser ablation, or later as desired. The activation cycle, as described above, may comprise a 15 second immersion treatment in an M629 bath, an activation solution known in the art for removing surface oxide prior to gold plating.

I claim:

1. A method for controlling the formation of an oxide layer on a metallic substrate over which a polymeric plating resist has been placed, then selectively removed by a focussed excimer laser beam applied thereto, comprising the steps of applying a carbon-containing polymeric plating resist to a metal substrate having a natural oxide layer thereon of a thickness between about 20 to 40 Å, subjecting a selected area of said resist coated metal substrate to a single shot from an excimer laser to ablate said resist from within said area, wherein the laser energy is absorbed primarily at the metallic substrate and the energy density of the said laser is in excess of that required to ablate so as to produce a thin uniform layer of oxide having a thickness no greater than about 7 Å over said substrate, said substrate exhibiting a carbon enriched sub-surface layer beneath the ablated area to improve the surface characteristics thereof.

2. The method according to claim 1 wherein said metallic substrate is a nickel plated copper alloy.

3. The method according to claim 2 wherein said energy density is from 10 to 100% greater than the energy required to effect such ablation.

4. The method according to claim 3 wherein said energy density is a value between about 2.0 J/cm² and 2.50 J/cm².

* * * * *